United States Patent [19]
Yang et al.

[11] Patent Number: 5,380,673
[45] Date of Patent: Jan. 10, 1995

[54] DRAM CAPACITOR STRUCTURE

[75] Inventors: Ming-Tzong Yang; Chen-Chiu Hsue, both of Hsin Chu; Anchor Chen, Hsin-Chu City, all of Taiwan, Prov. of China

[73] Assignee: United Microelectronics Corporation, Hsinchu, Taiwan, Prov. of China

[21] Appl. No.: 239,130

[22] Filed: May 6, 1994

[51] Int. Cl.$^6$ .......................................... H01L 21/70
[52] U.S. Cl. ................................... 437/47; 437/48; 437/52; 437/60; 437/919
[58] Field of Search ................ 437/47, 48, 52, 60, 437/192, 919; 257/306, 309, 307

[56] References Cited

U.S. PATENT DOCUMENTS

| | | | |
|---|---|---|---|
| 5,061,650 | 10/1991 | Dennison et al. | 437/47 |
| 5,084,405 | 1/1992 | Fazan et al. | 437/52 |
| 5,126,916 | 6/1992 | Tseng | 361/313 |
| 5,192,702 | 3/1993 | Tseng | 437/47 |
| 5,200,635 | 4/1993 | Kaga et al. | 257/306 |
| 5,217,914 | 6/1993 | Matsumoto et al. | 437/47 |
| 5,227,322 | 7/1993 | Ko et al. | 437/52 |
| 5,233,212 | 8/1993 | Ohi et al. | 257/390 |
| 5,266,514 | 11/1993 | Tuan et al. | 437/52 |
| 5,273,925 | 12/1993 | Yamamaka | 437/52 |

FOREIGN PATENT DOCUMENTS 0404553  12/1990  European Pat. Off. .

OTHER PUBLICATIONS

"A Newly Designed Planar Stacked Capacitor Cell with High dielectric Constant Film for 256mbit DRAM", by T. Eimori et al., IEEE International Electronic Device Meeting Proceedings, Dec. 1993, pp. 631–634.

Primary Examiner—Tom Thomas
Attorney, Agent, or Firm—George O. Saile

[57] ABSTRACT

A new structure and method for fabricating a stacked capacitor with increased capacitance and which is more manufacturable was accomplished. The stacked capacitor is part of a dynamic random access memory (DRAM) cell for storing charge on the capacitor and together with a field effect transistor (MOSFET) make up the individual DRAM storage cells on a DRAM chip. Fabricating this improved stacked capacitor involves using an additional electrically conducting layer in the polysilicon layer of the bottom electrode. For example, this layer can be composed from materials in the metal nitride group having high conductivity. One preferred choice being titanium nitride (TiN). The bottom electrode is formed by depositing and patterning a thin layer of polysilicon and a thin layer of the electrically conducting layer and then depositing an upper layer of polysilicon from which vertical sidewalls are formed. The conducting layer provides an etch end point for accurately etching to the correct depth. This provided for a repeatable and more manufacturable process. The stacked capacitor is then completed by depositing a high dielectric constant insulator layer over the bottom electrode and forming a top capacitor electrode to complete the stacked capacitor. The bottom electrode contacts one source/drain contacts of the MOSFET and the bit line contacts the other source/drain contact completing the improved DRAM cell.

18 Claims, 8 Drawing Sheets

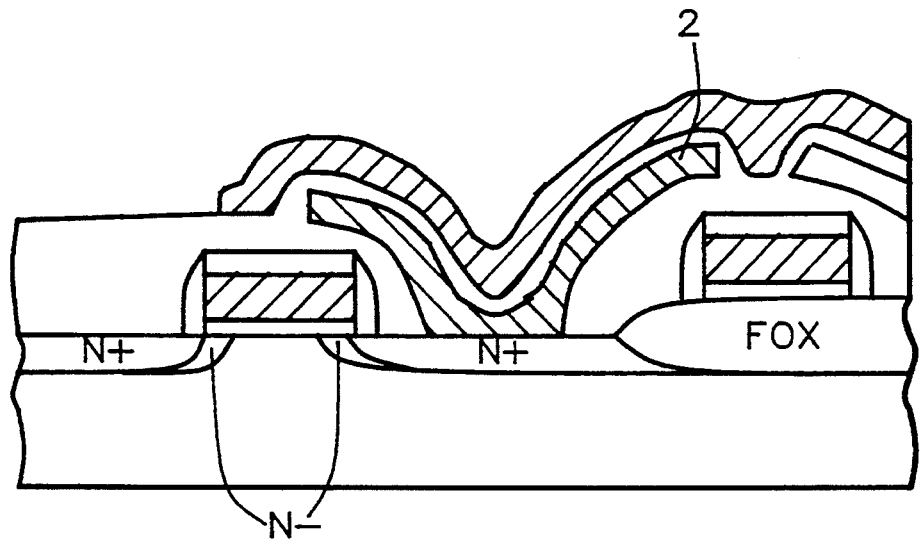
*FIG. 1A – Prior Art*
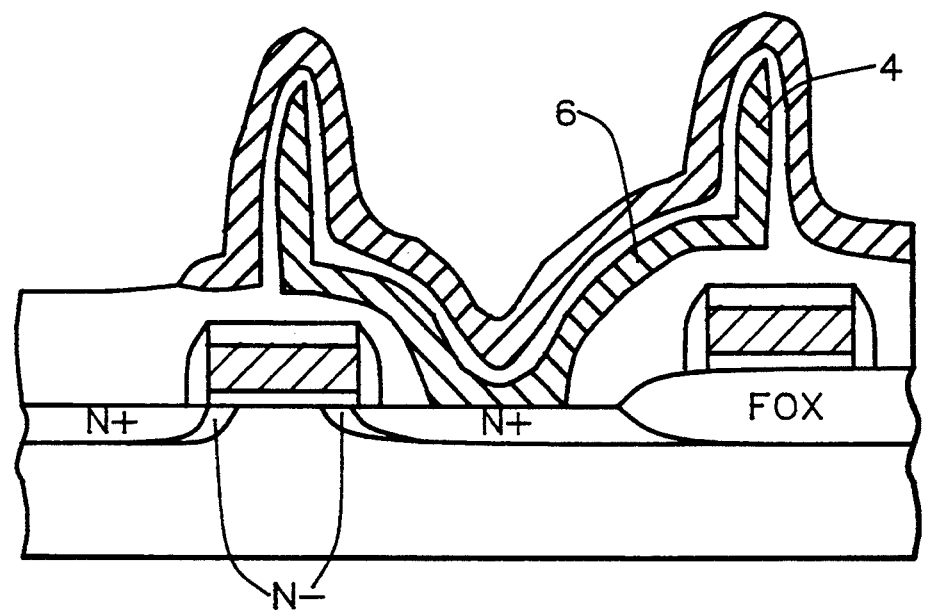
*FIG. 1B – Prior Art*

DRAM CAPACITOR STRUCTURE

RELATED PATENT APPLICATION

Ser. No. 08/231,461 filed Apr. 22, 1994 entitled NEW DRAM CAPACITOR STRUCTURE AND PROCESS by A. Chen, M. T. Yang, G. Hong and C. C. Hsue.

BACKGROUND OF THE INVENTION

1. Field of the Invention

This invention relates to a random access memory device and more particularly, a method for fabricating a stacked storage capacitor with vertical sidewalls having increased capacitance.

2. Description of the Prior Art

Very large scale integration (VLSI) semiconductor technologies have dramatically increased the circuit density on a chip. The miniaturized devices built in and on semiconductor substrate, making up these circuits, are very closely spaced and their packing density has increased significantly. More recent advances in photolithographic techniques, such as phase-shifting masks, and self-aligning process steps have further reduced the device size and increased circuit density. This has lead to ultra large scale integration (ULSI) with minimum device dimensions less than a micrometer and more than a million transistors on a chip. With this improved integrations, some circuit elements experience electrical limitation due to their down sizing.

One such circuit element experiencing electrical limitations is the array of storage cells on a dynamic random access memory (DRAM) chip. These individual DRAM storage cells, usually consisting of a single metal-oxide-semiconductor field-effect-transistor (MOSFET) and a single capacitor are used extensively in the electronic industry for storing data. A single DRAM cell stores a bit of data on the capacitor as electrical charge.

As the array of cells on the DRAM chip increase in number and the capacitor decreases in size. It becomes more difficult to maintain an acceptable signal-to-noise level. Also, these volatile storage cells require more frequent refresh cycles to retain their charge.

These storage capacitors can be formed either in the substrate, usually referred to as trench capacitor, or by forming a stacked capacitor on the substrate after first fabricating the MOSFET. The latter approach has received considerable attention in recent years. However, since each stacked capacitor, in the array of cells, are confined within the cell area it is difficult to maintain sufficient capacitance, as the cell size decreases. As conventional methods of high resolution photolithography and anisotropic etching reach their limits, it becomes necessary to explore other methods for increasing the capacitance.

One method of increasing the capacitance is to roughen the surface of the bottom electrode of the capacitor to effectively increase the surface area without increasing its overall size. See, for example, H. C. Tuan et.al. U.S. Pat. No. 5,266,514. Another approach is to use an inter-electrode insulator having a high dielectric constant. See for example, "A Newly Designed Planar Stacked Capacitor Cell with High Dielectric Constant Film for 256 Mbit DRAM" by T. Eimori et al, IEEE International Electronic Device Meeting Proceedings, December 1993 page 631–634. A third approach, which has received much attention, is to build three dimensional capacitor structure extending vertically upward over the cell area. For example, see H-H Tseng, U.S. Pat. No. 5,126,916. In that patent, a free standing insulating sidewall is formed over the cell area. Then the bottom electrode, the inter-electrode dielectric and the top electrode are deposited over the insulator sidewall to form the capacitor. Another approach by P. Fazan et al, U.S. Pat. No. 5,084,405 uses a double sidewall technique to form a double ring stacked cell structure. And in U.S. Pat. No. 5,233,212 M. Ohi et al the vertical sidewall of the capacitor is formed by depositing the capacitor electrode material on the sidewall of a recessed in an insulator. A number of other inventions also teach methods of forming vertical capacitor structures, either by forming multiple sidewalls and/or by timed etching. For example, see C. H. Dennison et al U.S. Pat. No. 5,061,650, S. Matsumoto et al U.S. Pat. No. 5,217,914, and H-H Tseng U.S. Pat. No. 5,192,702.

However, many of these methods require substantially more processing steps or/and planar structures which make the manufacturing process more complex and costly. Also, other process methods rely on etching to a predetermined etch depth which can be quite difficult to control in a manufacturing environment. For example, during plasma etching outgassing, virtual or real leaks, back streaming from pumps and loading effects, to name a few, can change the chemistry of the etching environment in the process chamber, making a calibrated etch time approach difficult to control. Therefore, it is very desirable to develop processes that are as simple as possible and also provide methods for monitoring, in situ, the etch depth during processing.

In the prior art, as shown by the schematic cross-sectional view in FIG. 1-A, a conventional DRAM cell usually has a stacked capacitor with a minimal electrode surface area 2. In more advanced structures of the prior art, as shown in FIG. 1-B, vertical sidewalls 4 are formed to increase the electrode area 6. However, accurate and repeated control of the sidewall spacer height is difficult.

SUMMARY OF THE INVENTION

It is the principal object of the invention to provide a new process and a new stacked capacitor structure with vertical sidewalls for producing a DRAM cell having increased capacitance.

It is another object of the invention to provide a repeatable manufacturing process by introducing a method for etching repeatedly to a precise depth in forming the vertical sidewalls on the bottom electrode.

It is still another object of the invention to form this storage capacitor with an economy of processing steps to maintain a high yield, good reliability and low cost.

These goals are achieved by incorporating an additional layer in the bottom polysilicon electrode of the capacitor. The layer which is composed of a material substantially different in composition from polysilicon is used as the etch end point layer. An etch mask formed by sidewall techniques is used to fabricate the narrow sidewalls in the bottom electrode of the stacked capacitor. The method for fabricating this improved capacitor on a dynamic random access memory (DRAM) cell is now described.

The fabrication process starts by first forming a relatively thick field oxide on the surface of the semiconductor substrate surrounding and isolating an array of active device regions wherein field effect transistors will be fabricated. A thin gate oxide is then grown on the substrate surface in the active device regions. A relatively thick polysilicon layer is deposited over the gate oxide and the field oxide. The polysilicon layers is then patterned to form the gate electrodes of the MOSFET in the device regions and conducting patterns elsewhere on the field oxide. Lightly doped source/drain regions are then formed adjacent to the gate electrodes in the active device regions. Insulating sidewalls are next formed by depositing an insulating layer and anisotropically etching back this layer to the substrate surface. The source/drain N-type contacts are then implanted completing the MOSFET.

The stacked capacitor, incorporating a multi-layered bottom electrode, is now formed by depositing a thin N-type doped polysilicon layer followed by the deposition of an electrically conducting layer differing substantially in composition from polysilicon. The material of choice is a low resistivity nitride such as titanium nitride (TiN). Also, refractory metal of metal silicides can also be used. Alternatively, a ultra thin native oxide can be used in place of the titanium nitride. Conventional photolithographic techniques and etching are then used to pattern the polysilicon/electrically conducting layer forming the base of the bottom electrode of the stacked capacitor. The array of bottom electrodes are formed over and aligned to the active device areas and each electrode of the array making electrical contact to one of the two source/drain contacts of a MOSFET, thereby, forming the node contact of the stacked capacitor. Next, a relatively thick polysilicon layer is deposited over the patterned polysilicon/electrically conducting layer to finish the bottom electrode deposition.

The vertical sidewall of the bottom electrode is now formed by masking and anisotropically etching the thick top polysilicon to the electrically conducting layer. The capacitor sidewall mask is formed by depositing a chemical vapor deposited (CVD) silicon oxide layer over the thick polysilicon layer and patterning the silicon oxide to form an array of oxide areas over and aligned to the array of patterned polysilicon/titantium nitride areas. A silicon nitride ($Si_3N_4$) layer is deposited over the array of oxide areas and anisotropically etched back to form sidewall spacers along the patterned silicon oxide edges. The silicon oxide is removed using conventional wet etching leaving a ring of sidewall silicon nitride as an etch mask. The thick polysilicon layer is then anisotropically etched to the underlying electrically conducting layer, forming vertical polysilicon sidewalls and completing the array of bottom electrodes of the stacked capacitors. The electrically conducting layer is very important because it provides the means for accurately etching to the correct depth, which is required for a manufacturable process. The end point of the etch process is accurately determined by in situ monitoring the change in the intensity of the optical emission of the spectral line from one of the etch by-product species using optical emission spectroscopy. The remaining silicon nitride mask material is removed using a conventional wet etch, such as hot phosphoric acid. A high dielectric insulator is deposited to form the inter-electrode insulator, and another doped polysilicon layer is deposited to form the top electrode and complete the array of storage capacitors.

BRIEF DESCRIPTION OF THE DRAWINGS

The objects and advantages of this invention are best understood by the preferred embodiment with reference to the attached drawings which are now briefly described.

FIG. 1-A is a schematic cross-sectional view of a conventional DRAM cell with a stacked storage capacitor having minimal electrode surface area 2.

FIG. 1-B shows a cross-sectional view of a DRAM cell with a stacked storage capacitor, but with a vertical sidewall 4 formed by making a polysilicon spacer to increase the electrode area 6. Accurate and repeated control of the sidewall spacer height is difficult.

DESCRIPTION OF THE PREFERRED EMBODIMENTS

Now in keeping with the objects of this invention, the method for forming a DRAM storage capacitor having vertical sidewalls and increased capacitance is described in detail. The sequence of fabrication steps are shown in FIGS. 2 through 9. The process for forming the Field OXide (FOX) and the field effect transistor structure as presently practiced in manufacturing DRAM cells are only briefly described in order to better understand the current invention.

It should also be well understood by one skilled in the art that by including additional process steps not described in this embodiment, other types of devices can also be included on the DRAM chip. For example, P channel MOSFETs can be formed by providing N-Wells in the P substrate and CMOS circuits can be formed therefrom. It should also be understood that the Figs. depict only one DRAM storage cell out of a multitude of cells that are fabricated simultaneously on the substrate.

Figure 2:
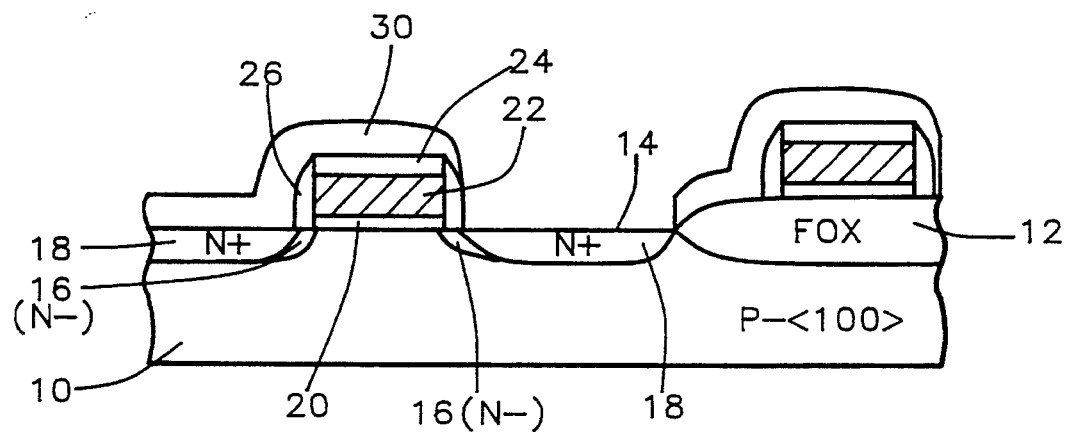
FIG. 2 is a schematic cross-sectional view of a partially completed DRAM cell prior to forming the stacked capacitor of this invention. Shown is a portion of the field oxide 12, the field effect transistor and the opening to a source/drain contact 18 that will form the node contact for the capacitor.

Referring now to FIG. 2, a cross-sectional view of the substrate 10 having a partially completed DRAM cell formed on and in the substrate surface, is schematically shown. The preferred substrate is composed of a P-type single crystal silicon having a (100) crystallographic orientation. A relatively thick Field OXide (FOX) 12 is formed around the active device areas to electrical isolate these areas. This field oxide, only partially shown in FIG. 2, is formed by masking the active device areas with a thin silicon oxide (pad oxide) and a thicker silicon nitride layer which forms an oxidation barrier. The silicon substrate is then oxidized in an oxidizing ambient to form the field oxide. The preferred thickness being in the range of about 4500 to 5500 Angstroms.

The semiconductor device is then formed in the active device area after removing the silicon nitride barrier layer and the pad oxide in a conventional wet etch. The most commonly used device for dynamic random access memory is the MOSFET. This device is formed by first thermally oxidizing the active device area to form a thin gate oxide 20. The preferred thickness being from about 90 to 200 Angstroms. An appropriately doped polysilicon layer 22 and an insulating layer 24 are deposited on substrate 10 and a conventional photolithographic techniques are used to pattern the insulating layer 24 and the polysilicon layer 22. This forms the gate electrode 22 of the MOSFET in the active device areas and conducting patterns elsewhere on the substrate having an insulating layer 24 thereon. Portions of these conducting patterns form the word lines that electrically connect the MOSFET gate electrode to the appropriate peripheral circuits on the DRAM chip. The lightly doped source/drain 16 of the N-channel MOSFET is formed next, usually by implanting a N-type atomic species such as arsenic or phosphorus. For example, a typical implant might consist of phosphorus $P^{31}$ at a dose of between 1 and 10 E13 atoms/cm$^2$ and at an energy between about 30 to 80 Kev.

After forming the lightly doped source/drain, sidewall spacers 26 are formed on the gate electrode sidewalls. These sidewall spacers are formed by depositing a low temperature silicon oxide and anisotropically etching back to the silicon surface. For example, the silicon oxide could be a chemical vapor deposition using tetraethoxysilane (TEOS) at a temperature in the range of about 650° to 900° C. and the etch back performed in a low pressure reactive ion etcher.

The source/drain regions 18 of the MOSFET are now implanted with a N type atomic species, for example, arsenic ($As^{75}$), to complete the source/drain 18. The implantation is usually done through a thin layer of silicon oxide of about 200 to 300 Angstroms in thickness to minimize implant channeling and to protect against contamination by metals and other impurities. A typical implantation dose being between about 2 E15 to 1 E16 atoms/cm$^2$ and an energy of between about 20 to 70 Kev.

The remainder of this embodiment relates more specifically to those objects of the invention, which relate to the formation of the stacked storage capacitor having increased capacitance and also providing a more manufacturable process. The new capacitor structure is formed having vertical sidewalls and having a multi-layered bottom electrode.

Still referring to FIG. 2, a first insulating layer 30, composed in part of silicon nitride, is deposited over the active device areas having MOSFETs with source/drain areas and over the thick field oxide elsewhere on the substrate. The preferred composition of the first insulating layer is a chemical vapor deposited (CVD) silicon oxide having a thickness of between about 1000 to 3000 Angstroms and an upper silicon nitride layer having a thickness between about 500 to 1500 Angstroms. The preferred method for depositing silicon nitride is by a low pressure chemical vapor deposition (LPCVD) technique having a process temperature in the range between about 700° to 800° C.

The contact opening 14 for the capacitor node contact, of the storage capacitor, is now selectively formed to one of the two source/drain areas by etching through the first insulating layer 30. The contact opening is formed by using conventional photolithographic techniques and etching in a low pressure plasma etcher having a high silicon oxide to silicon etch rate selectivity. For example, a gas mixture of carbon tetrafluoride and hydrogen ($CF_4/H_2$) can be used as the etching gas.

Figure 3:
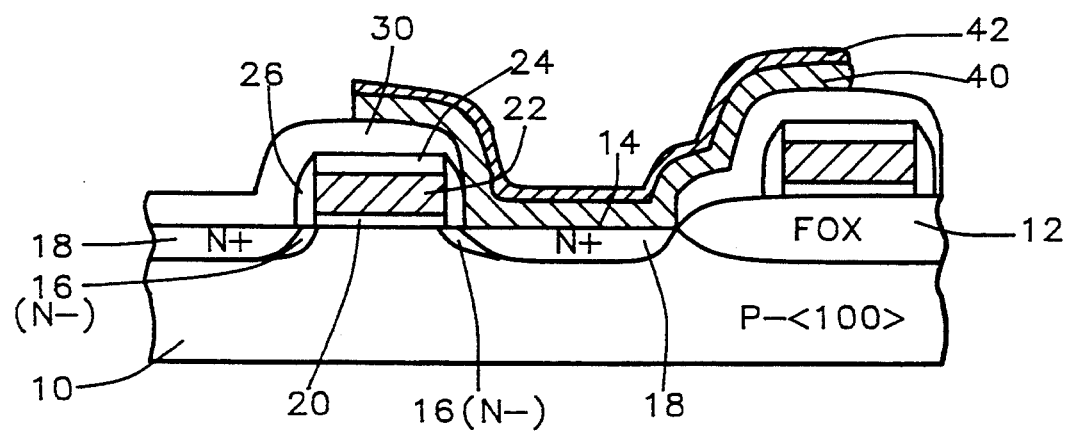
FIG. 3 is a schematic cross-sectional view of the DRAM cell in FIG. 2 showing the deposition of the multi-layer for the bottom electrode consisting of a thin first polysilicon layer 40, a dissimilar electrically conducting layer 42. The multi-layer is patterned over and aligned to the active device area defining the capacitor area.

Referring now to FIG. 3, the bottom electrode of the storage capacitor is formed by depositing a film composed of two layers. A relatively thin first polysilicon layer 40 is deposited over the first insulating layer 30 and in the contact opening 14, forming the capacitor node contact to one of the two source/drain contacts. The preferred thickness of this first polysilicon layer 40 is between about 300 to 1000 Angstroms. The process of choice for depositing the layer is in a LPCVD reactor at a process temperature of between about 550° to 650° C. The polysilicon layer 40 is doped N-type by ion implantation using, for example, arsenic ions and having an implant dose of between about 1 E15 to 20 E15 atoms/cm$^2$ and an ion energy of between about 20 to 80 Kev. Alternatively, the polysilicon layer 40 can be doped in situ during the polysilicon deposition.

An electrically conducting layer 42 is next deposited over the first polysilicon layer 40 being substantially different in composition to the polysilicon layer. This difference in composition is very important because it is used at a later process step to accurately determine the endpoint stop for etching. And it is this accuracy in etching which makes the process repeatable from wafer to wafer and process run to process run providing a manufacturable process. The accuracy of this end point detect also makes the vertical height of the capacitor side wall repeatable.

The material of choice for this electrically conducting layer is a metal nitride and more particularly the refractory metal nitride, titanium nitride (TiN) because of its low electrical resistivity which is about 21.0 Microhm-cm. The preferred thickness being of between about 100 to 1000 Angstroms. The deposition method of choice is a reactive sputter deposition process using a titanium target and sputtering in the presents of a argon/nitride gas mixture.

Another family of materials that can also be used as the electrically conducting layer 42 are the refractory metals and their silicides. For example tungsten (W) and tungsten silicide (WSi). Alternatively, an ultra thin oxide formed on the first polysilicon layer 40, such as the native oxide formed during normal wet processing, can also be used in place of the electrically conducting layer 42. The preferred thickness of this thin oxide layer being between about 20 to 50 Angstroms.

Referring still to FIG. 3, conventional photlithographic techniques and etching are used to pattern the multi-layer of polysilicon layer 40 and the electrically conducting layer 42 forming an array of areas. These poiysilicon/electrically conducting areas being over and aligned to the active device areas and each individual area contacting one of the source/drains of a MOSFET, thus forming the capacitor node contact and a portion of the bottom capacitor electrode. Only one cell area of which is shown in FIG. 3.

Figure 4:
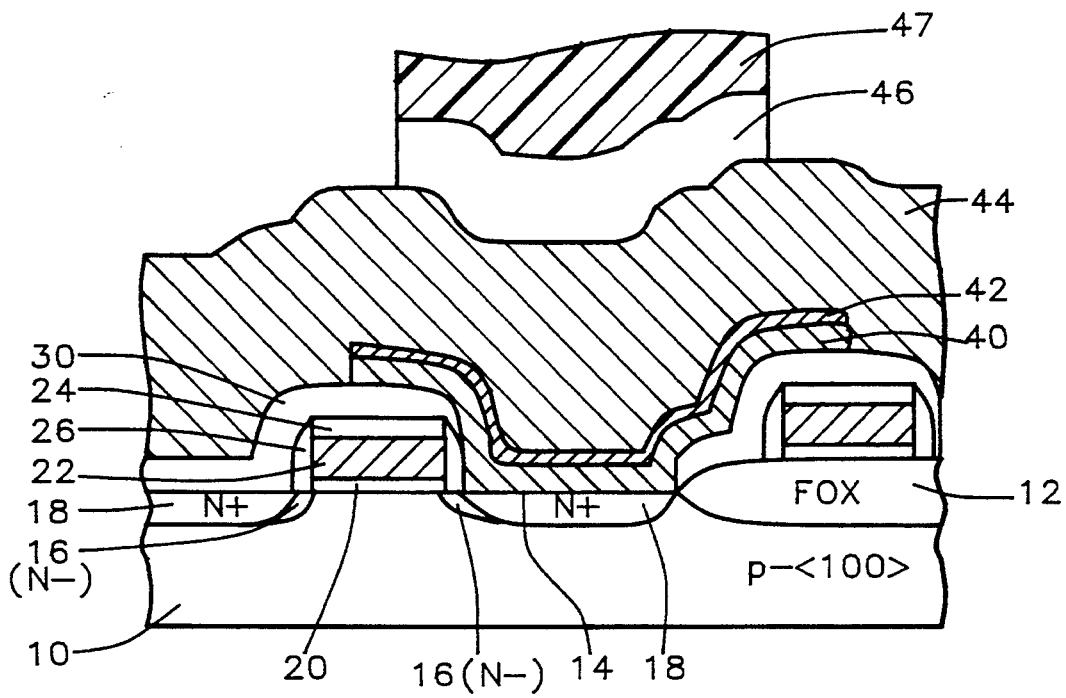
FIG. 4 is a schematic cross-sectional view of the DRAM cell in FIG. 3 showing a thick second polysilicon layer deposited 44 over the patterned multi-layer and then a patterned silicon oxide layer 46 aligned and over the capacitor area with the photoresist mask 47 still in place.

Referring to FIG. 4, a relatively thick second polysilicon layer 44 is deposited over the patterned poiysilicon layer 40/electrically conducting layer 42. The vertical sidewalls of the bottom electrode are then formed from this layer 44. The preferred thickness of polysilicon layer 44 is between about 1500 to 4000 Angstroms and the preferred method of deposition is in a LPCVD reactor having a processing temperature of between about 550° to 650° C. This second polysilicon layer 44 is doped N-type by implanting with arsenic ($As^{75}$) or phosphorous ($P^{31}$) having an implant dose of between about 1 E15 to 1 E16 atoms/cm$^2$ and an ion implant energy of between about 20 to 120 Kev.

A second insulating layer 46 is next deposited. The preferred insulator being a chemical vapor deposited (CVD) silicon oxide which is then patterned to form a silicon oxide area 46 over the second polysilicon layer 44 and over and aligned to the first polysilicon patterned layer 40 and electrically conducting area 42. The layer 46 is etched using conventional photolithographic techniques and anisotropic etching. The patterned silicon oxide area 46 with the photoresist mask 47 still thereon is shown in FIG. 4. The preferred thickness of the silicon oxide layer being between about 1000 to 3000 Angstroms.

Figure 5:
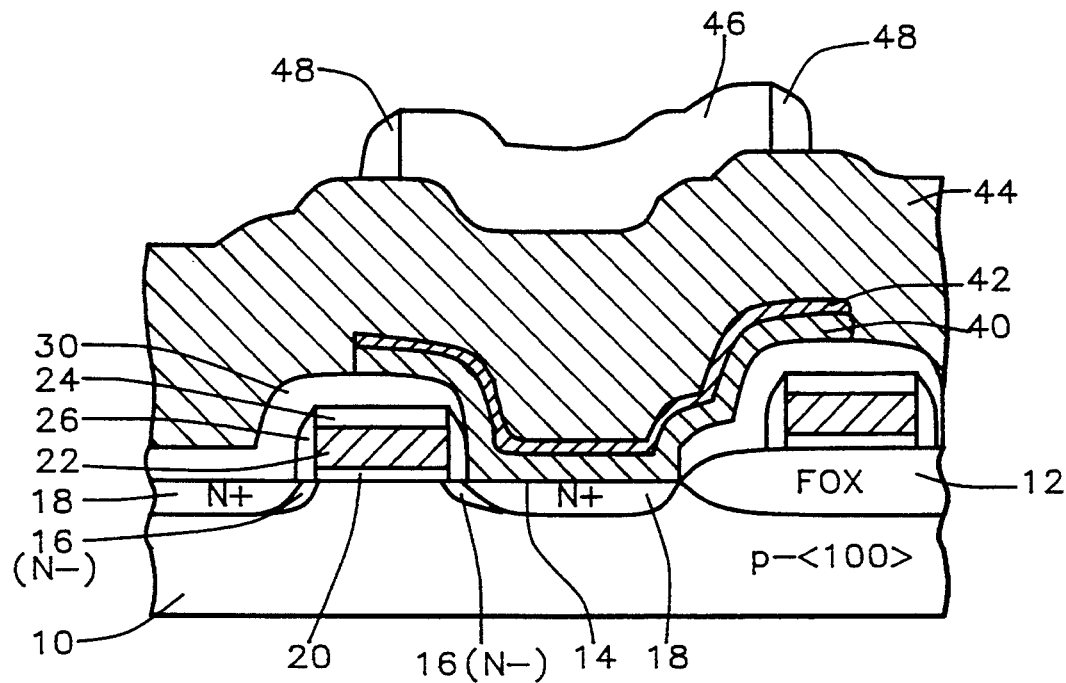
FIG. 5 is a schematic cross-sectional view of the DRAM cell in FIG. 4 showing the formation of the silicon nitride ($Si_3N_4$) sidewall spacer 48 on the patterned silicon oxide sidewall. This $Si_3N_4$ sidewall spacer forms the mask for etching the vertical polysilicon sidewall.
Figure 6:
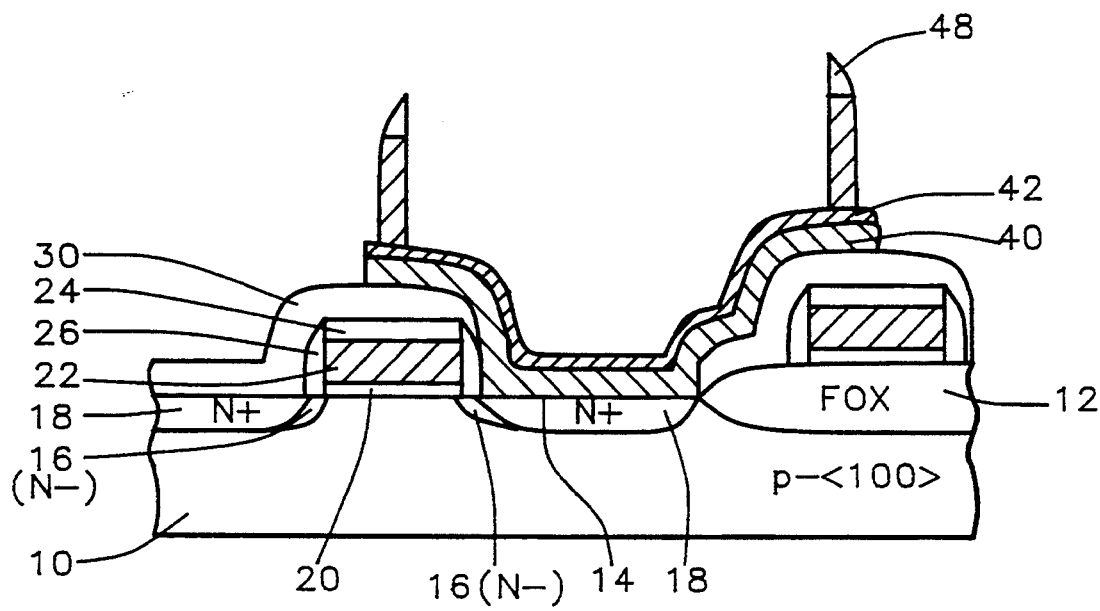
FIG. 6 is a schematic cross-sectional view of the DRAM cell in FIG. 5 showing the silicon oxide removal and the second polysilicon layer 44 etched with the $Si_3N_4$ spacers 48 as the etch mask and the electrically conducting layer 42 thereunder as the etch end point detect layer.

Referring next to FIG. 5, a third insulating layer of silicon nitride ($Si_3N_4$) is deposited and sidewall spacers 48 are now formed on the patterned silicon oxide sidewalls after removing the photoresist mask 47. The sidewall spacers are later used as the mask for forming vertical polysilicon sidewalls on the bottom electrode of the stacked capacitor. These silicon nitride spacers 48 are formed by depositing the silicon nitride layer over the silicon oxide area 46 and then anisotropically etching back to the surface of the polysilicon layer 44. The exposed silicon oxide areas 46 are then removed using conventional wet etching in a buffered hydrofluoric acid leaving free standing an array of silicon nitride spacers 48. The polysilicon layer 44 is then anisotropically etched to the surface of the electrically conducting layer 42 as shown in FIG. 6. The electrically conducting layer 42 serves as the etch end point detect layer. This etching, using the silicon nitride spacers as the mask, form the vertical polysilicon sidewalls on the capacitor bottom electrode.

The etch end point is accurately determined by using optical emission spectroscopy and monitoring one of the spectral lines of the etch by-product over the wafer in the plasma chamber. For example, one can monitor the spectral emission from the silicon fluoride (SiF) by-product having a spectral wavelength of 4050 Angstroms. The technique relies on the change in the emission intensity of the characteristic spectral line as the etched surface changes from one type of material to another. In this way the end point can be accurately detected when the second polysilicon layer 44 is etched to the electrically conducting layer 42. The etch process is then terminated. This provides a means for etching accurately from wafer to wafer and from process run to process run making a more manufacturable process. The height of the sidewall is therefore, equal to the second polysilicon layer 44 thickness which is easier to control than a timed etching in a single layer polysilicon.

The formation of the polysilicon vertical sidewalls over and aligned to the patterned first polysilicon layer 40 and electrically conducting layer 42 complete the formation of the bottom electrode of the stacked capacitor. A cross sectional view of this bottom electrode is shown in FIG. 6 with the silicon nitride spacers still in place.

Figure 7:
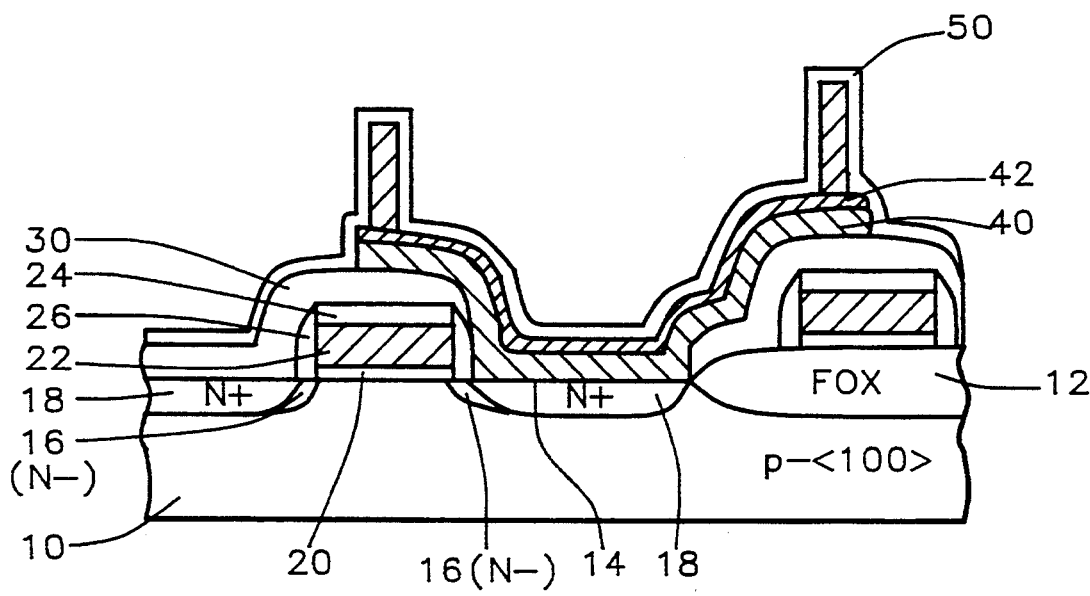
FIG. 7 is a schematic cross-sectional view of the DRAM cell in FIG. 6 after the $Si_3N_4$ spacers 48 are removed and a high dielectric constant insulator 50 is deposited over the completed bottom electrode of the stacked capacitor.
Figure 8:
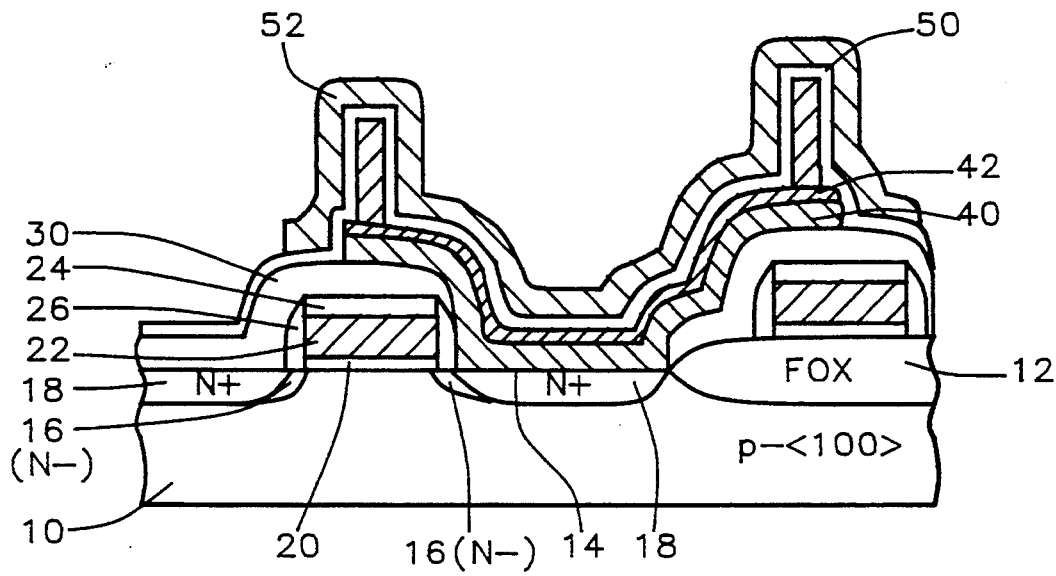
FIG. 8 is a schematic cross sectional view of the DRAM cell in FIG. 7 showing the deposition of a third polysilicon layer 52 as the top electrode completing the stacked capacitor.

Referring to FIG. 7, the silicon nitride spacers are removed and the storage capacitor is completed by depositing a dielectric layer 50 having a high dielectric constant and then, as shown in FIG. 8, depositing a third polysilicon layer 52 to form the top capacitor electrode and complete the storage capacitor of the DRAM cell.

The preferred thickness of the dielectric layer 50 is in the range of about 30 to 250 Angstroms. The material of the dielectric layer can be any suitable material having a high dielectric constant and being continuous and pin hole free. The preferred dielectric layer being a silicon oxide—silicon nitride—silicon oxide (ONO) layer having a total thickness in the range between about 30 to 250 Angstroms. Alternatively, other high dielectric constant materials can be used. For example, tantalum pentoxide and suitable combinations thereof.

Still referring to FIG. 8, the third polysilicon layer 52 is deposited over the dielectric layer 50 and conventional photolithograhic techniques and anisotropic etching are used to suitably pattern the layer, forming the top capacitor electrode. The preferred thickness of the third polysilicon layer 52 is between about 1000 to 2000 Angstroms. The preferred deposition technique is performed in a LPCVD reactor at a temperature in the range of about 550° to 650° C.

Figure 9:
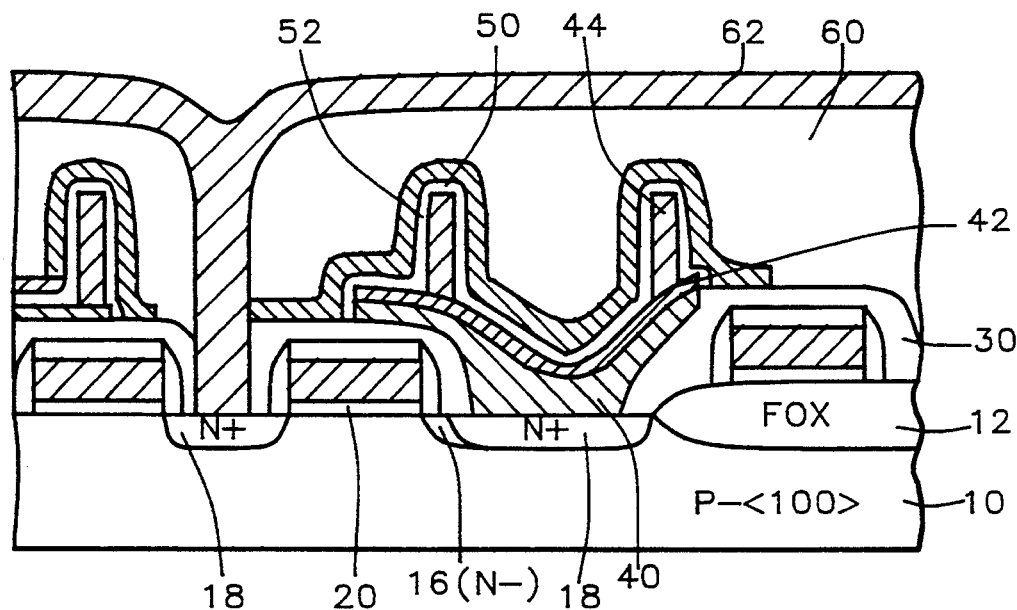
FIG. 9 is a schematic cross sectional view of the DRAM in FIG. 8 showing a completed DRAM cell having a borophosphosilicate (BPSG) insulating layer 60, an opening for a bit line contact and the bit line metallurgy 62.

Referring now to FIG. 9, a cross sectional view of a single completed DRAM cell of an array of cells is shown. A fourth insulating layer 60 is deposited over the DRAM cell. The preferred fourth insulating layer 60 is composed of two insulating layers, an undoped silicon oxide layer deposited by atmospheric pressure chemical vapor deposition (APCVD) having a thickness of between about 1000 to 2000 Angstroms and an upper layer of a low flow temperature glass composed of borophosphosilicate glass (BPSG) having a thickness in the range of about 4000 to 8000 Angstroms. The BPSG layer is then annealed to planarize the surface. The bit line contact mask and an appropriate photolithographic process is used to open the bit line contact in the fourth insulation layer 60 and the first insulating layer 30 to the second of the two source/drain contacts of the MOSFET. A fourth polysilicon layer 62 is deposited and doped N-type to form the bit line metallurgy. Alternatively, a silicide layer can be formed on the fourth polysilicon layer 62 to increase its conductivity. The preferred method being the deposition of a thin metal layer followed by a low temperature anneal to form the silicide. The preferred metal silicide being tungsten silicide (WSi). The polysilicon/silicide bit line wiring is then patterned using a photolithographic process and a reactive ion etch process to complete the DRAM storage cell.

Referring now to FIGS. 10 through 14, there is shown a second embodiment of the invention for fabricating a stacked capacitor which further increases the capacitance. This is achieved by making special use of silicon nitride layer comprising the top layer of layer 30 in FIG. 2. Many of the process steps are identical to the description in the first embodiment and are not described in the same detail in this second embodiment. The identical process steps up to the structure shown in FIG. 2 are the same for both embodiments. However, the first insulating layer 30 composed in part of silicon nitride and shown in FIG. 2, of the first embodiment, as a single layer is now distinguished in FIG. 10, of the second embodiment, as silicon oxide layer 31 and as silicon nitride layer 32.

Figure 10:
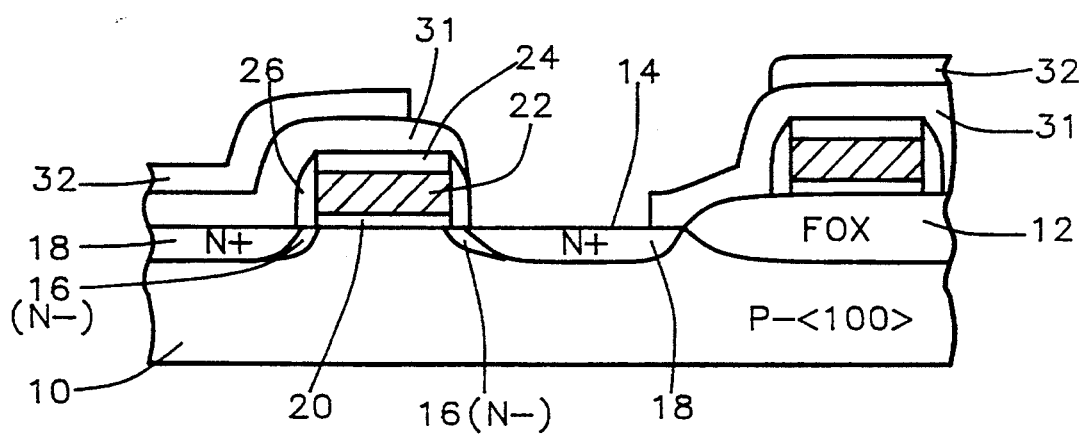
FIGS. 10 through 14 show the schematic drawings for a second embodiment of the invention, using a similar process as the first embodiment but with the use of an additional $Si_3N_4$ layer to further increase the capacitor electrode area.

Referring now to FIG. 10, conventional photolithographic techniques and etching are used to form an opening in silicon oxide layer 31 and silicon nitride layer 32 over and aligned to the source/drain contact 14. The silicon nitride layer 32 is then masked and etched to enlarged the opening in layer 32 to a size somewhat less than the size of the desired bottom electrode, as shown in FIG. 10.

Figure 11:
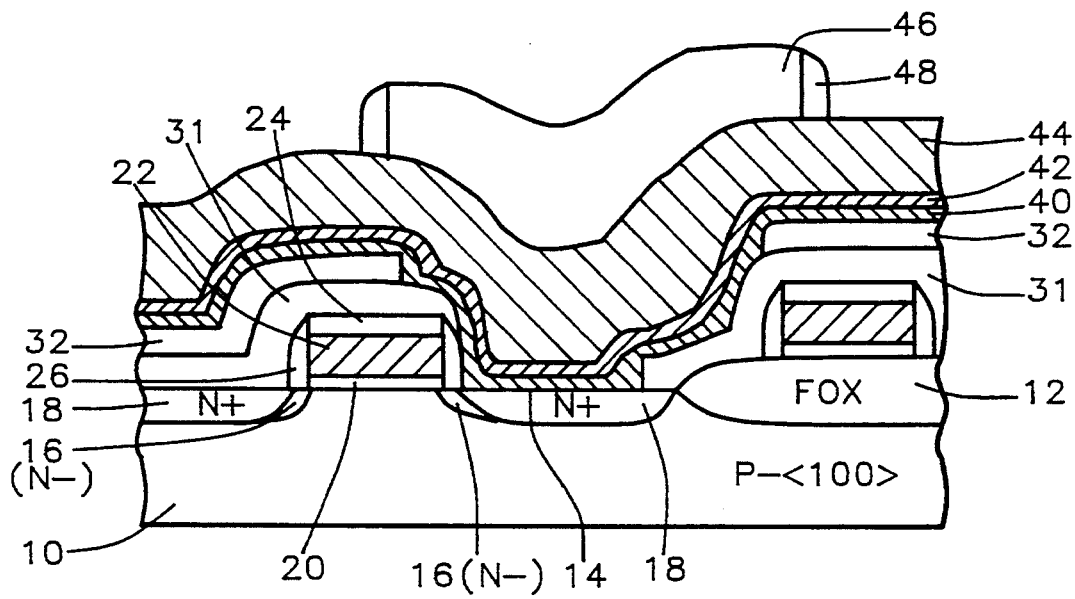

Now as shown in FIG. 11, the bottom electrode of the storage capacitor is formed. A relatively thin first polysilicon layer 40 is deposited on silicon nitride layer 32 and over and in the contact opening 14. Then an electrically conducting layer 42 is deposited on layer 40 which is substantially different in composition from polysilicon and then a relatively thick second polysilicon layer 44 is deposited as described in detail in the first embodiment and depicted in FIG. 11.

The bottom electrode of the storage capacitor is now formed from layer 40, 42 and 44 by using, as an etch mask, a patterned second insulating layer 46 composed of silicon oxide and having sidewall spacer formed from a third insulating layer 48 composed of silicon nitride. The process for forming the patterned layer 46 and having sidewalls formed from layer 48 is the same as described in the first embodiment and their utilization in this embodiment are shown in FIG. 11. As seen in FIG. 11, the patterned silicon oxide layer 46 and the silicon nitride sidewalls 48 are aligned over the contact opening 14 and overlapping the silicon nitride layer 32. This silicon nitride layer 32 extending underneath the masking oxide/nitride pattern, and as will be seen shortly, plays an important part in increasing the area of the bottom electrode.

Figure 12:
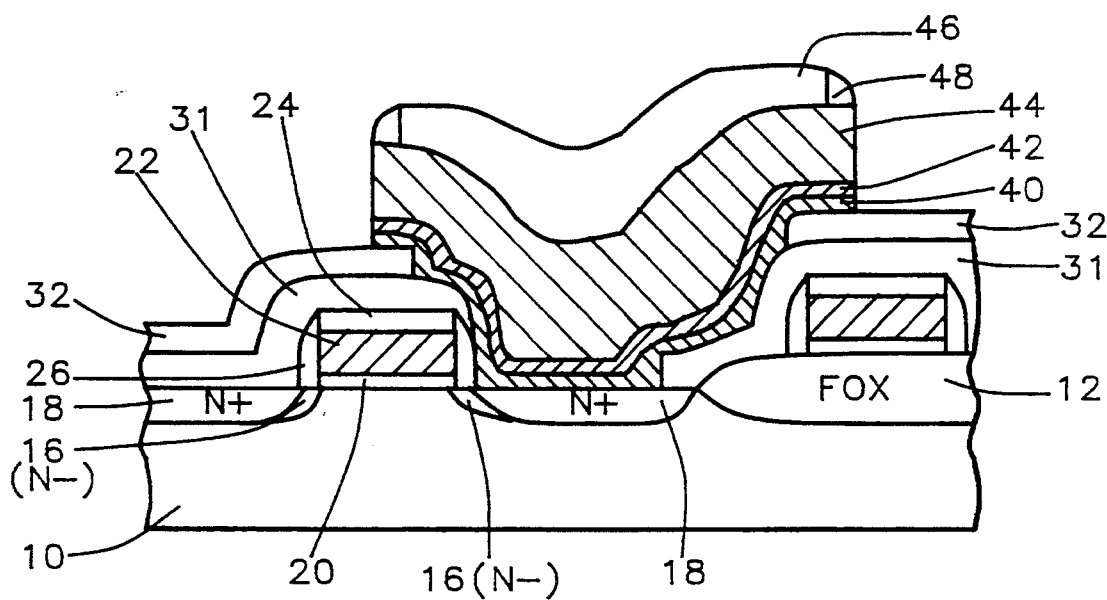
Figure 13:
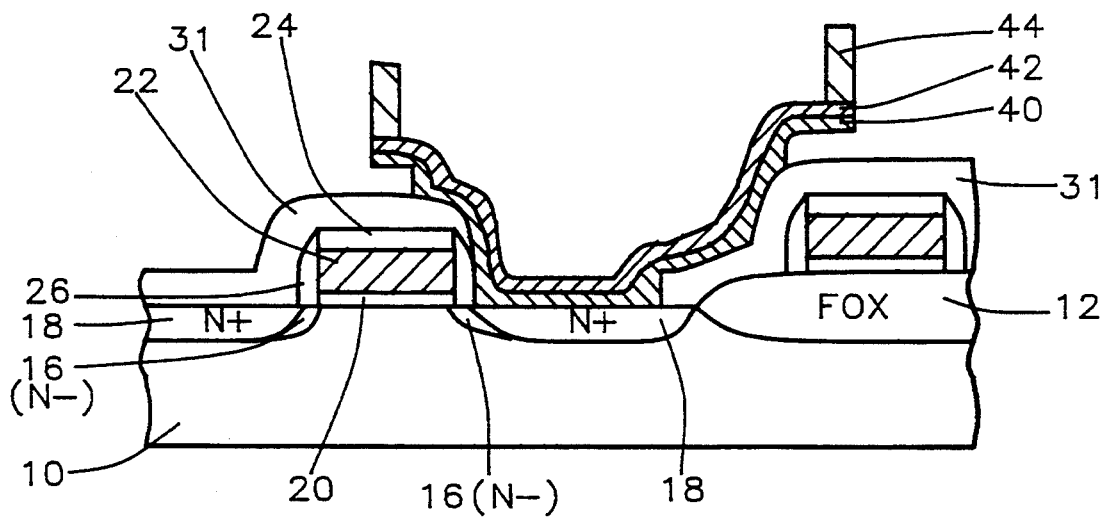

Now referring to FIG. 12, the silicon oxide masking layer 46 and sidewall 48 are used as a mask and the second polysilicon layer 44, the electrically conducting layer 42 and the thin first polysilicon layer 40, outside the cell area, are anisotropically etched to the silicon nitride layer 32. This forms the outside wall of the bottom electrode and electrically isolates the bottom electrode from other electrodes formed simultaneously on the substrate. The silicon oxide masking layer 46 is now selectively removed by etching in buffered hydrofluoric acid and the second polysilicon layer 44, within the cell area is anisotropically etched to the electrically conducting layer 42 using the end point detect method detailed in the first embodiment. The silicon nitride sidewall 48 and the silicon nitride layer 32 are isotropically etched, for example, in a heated phosphoric acid solution. This completes the bottom electrode structure as shown in FIG. 13. To further increase the electrode area, the layer 32, shown in FIG. 12, that extends under the bottom electrode is etched increasing further the electrode area.

Figure 14:
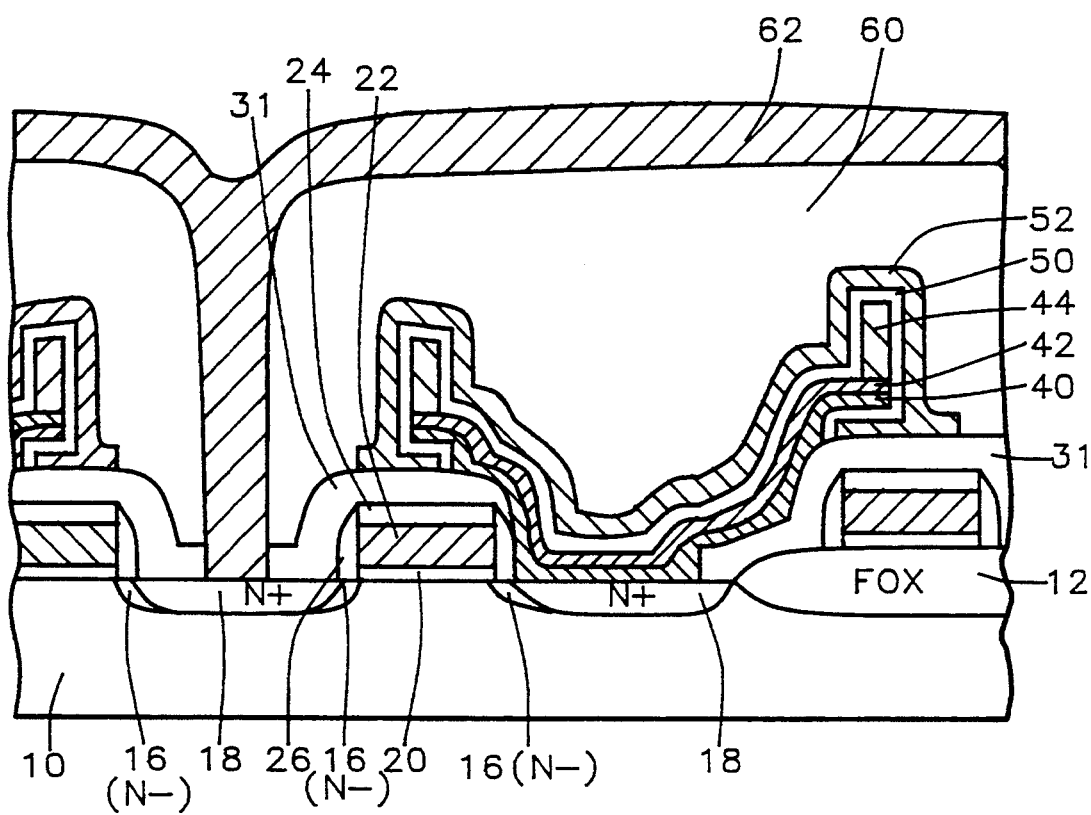

The final DRAM cell structure is now completed as described in detail in the first embodiment. Briefly, an inter-electrode dielectric layer 50 having a high dielectric constant is formed on the bottom electrode and a third polysilicon layer 52 is deposited to form the top capacitor electrode. A planarizing insulator layer 60 is formed and the bit line contact and bit line wiring 62 is formed to complete the DRAM cell as shown in FIG. 14.

While the invention has been particularly shown and described with reference to the preferred embodiments thereof, it should be understood by those skilled in the art that various changes in form and details may be made without departing from the spirit and scope of the invention.

What is claimed is:

1. A method for fabricating a high capacitance stacked capacitor on a semiconductor substrate having a device area formed therein comprising the steps of:

depositing a first insulating layer composed of silicon oxide over said device area and elsewhere over said substrate;

forming an opening in said first insulating layer to said device area providing a contact opening for said stacked capacitor;

depositing a doped first polysilicon layer over said substrate and over said contact opening thereby making ohmic contact to said device area;

depositing an electrically conductive layer on said first polysilicon layer, wherein said electrically conductive layer is not polysilicon;

masking and etching said first polysilicon layer and said electrically conducting layer forming a patterned area over and aligned to said device area;

depositing a second polysilicon layer over said patterned area of said first polysilicon layer and electrically conducting layer;

depositing a second insulating layer on said second polysilicon layer;

masking and etching said second insulating layer forming patterned insulating area over said second polysilicon layer and over and aligned to said patterned area of said first polysilicon and said electrically conducting layer;

depositing a third insulating layer ever said patterned area of said second insulating layer being of different insulator type;

etching said third insulating layer anisotropically forming sidewall spacers on said patterned second insulating layer and exposing surface of said patterned area of second insulating layer;

etching completely said second insulating layer forming free standing said sidewall spacers composed of said third insulating layer over said second polysilicon layer;

etching said second polysilicon layer to said electrically layer thereby forming vertical sidewalls aligned to and on said electrically conducting and first polysilicon layers;

etching completely said third insulating layer sidewall spacers and completing said bottom electrode of said stacked capacitor having said vertical sidewalls;

depositing a capacitor dielectric layer over and around said bottom capacitor electrode and elsewhere on said substrate having a high dielectric constant;

depositing a third polysilicon layer over said capacitor dielectric layer and forming a top capacitor electrode layer of said stacked capacitor;

masking over said stacked capacitor area and etching completely said third polysilicon layer to surface of said capacitor dielectric layer and completing said high capacitance stacked capacitor.

2. The method of claim 1, wherein said first insulating layer comprises a layer of silicon oxide wherein the thickness of said silicon oxide layer is between about 1000 to 3000 Angstroms.

3. The method of claim 1, wherein the thickness of said first polysilicon layer is between about 300 to 1000 Angstroms.

4. The method of claim 1, wherein said electrically conducting layer is a metal nitrides.

5. The method of claim 4, wherein said electrically conducting layer is titanium nitride.

6. The method of claim 1, wherein said electrically conducting layer is a refractory metal silicide.

7. The method of claim 5, wherein said electrically conducting layer provides an etch end point detect layer for said second polysilicon layer etch.

8. The method of claim 1, wherein the thickness of said electrically conducting layer is between about 100 to 1000 Angstroms.

9. The method of claim 1, wherein said electrically conducting layer can alternately be replaced by an ultra thin oxide layer having a thickness of between about 20 to 50 Angstroms.

10. The method of claim 1, wherein the thickness of said second polysilicon layer is between about 1500 to 4000 Angstroms.

11. The method of claim 1, wherein said capacitor dielectric layer is formed from the group consisting of silicon oxide, silicon nitride and tantalum pentoxide.

12. The method of claim 1, wherein said capacitor dielectric layer is between about 30 to 250 Angstroms in thickness.

13. The method of claim 1, wherein the thickness of said third polysilicon layer is between about 1000 to 2000 Angstroms.

14. The method of claim 1, wherein said masking and etching comprises the steps of photoresist masking and anisotropic etching in a low pressure plasma etcher.

15. The method of claim 1, wherein said end point detect is performed by monitoring the change in the emission intensity of a selected spectral line using optical emission spectroscopy techniques.

16. The method of claim 1, wherein said contact opening forms the node contact of said storage capacitor to said source/drain of a field effect transistor in said device area and forming a dynamic random access memory cell.

17. A method for fabricating a high capacitance stacked capacitor of a dynamic random access memory cell on a semiconductor substrate having a device area formed therein comprising the steps of:

depositing a first insulating layer composed in part of silicon nitride over said device area and elsewhere over said substrate;

forming an opening in said first insulating layer to said device area providing a contact opening for said stacked capacitor wherein said opening is said silicon nitride is larger than said contact opening:

depositing a doped first polysilicon layer wherein said electrically conductive layer is not polysilicon over said substrate and over said contact opening thereby making ohmic contact to said device area;

depositing an electrically conductive layer on said first polysilicon layer;

depositing a second polysilicon layer over said electrical conducting layer;

depositing a second insulating layer on said second polysilicon layer;

masking and etching said second insulating layer forming patterned insulating area over said second polysilicon layer and over and aligned to said contact openings;

depositing a third insulating layer over said patterned area of said second insulating layer and elsewhere over said substrate and said third insulating layer being of different insulator type;

etching said third insulating layer anisotropically and forming sidewall spacers on said patterned second insulating layer and exposing surface of said patterned area of said second insulating layer and exposing said second polysilicon layer elsewhere on said substrate;

etching said second polysilicon layer, said electrically conducting layer and said first polysilicon layer to said silicon nitride of said first insulating layer thereby forming vertical outer sidewalls for said capacitor;

etching completely said second insulating layer and exposing said second polysilicon layer inside said sidewall spacers composed of said third insulating layer and over said second polysilicon layer;

etching said second polysilicon layer to said electrically conducting layer and forming inside sidewalls for said capacitor;

etching completely said third insulating layer sidewall spacers and said silicon nitride portion of said first insulating layer and completing said bottom electrode of said stacked capacitor having said vertical sidewalls;

depositing a capacitor dielectric layer over and around said bottom capacitor electrode and elsewhere on said substrate having a high dielectric constant;

depositing a third polysilicon layer over said capacitor dielectric layer and forming a top capacitor electrode layer of said stacked capacitor;

masking over said stacked capacitor area and etching completely said third polysilicon layer to surface of said capacitor dielectric layer and completing said high capacitance stacked capacitor.

18. The method of claim 17, wherein etching of said silicon nitride part of said first insulating layer increases the surface area of said storage capacitor.

* * * * *